(12) United States Patent
Huynh et al.

(10) Patent No.: US 7,088,586 B2
(45) Date of Patent: Aug. 8, 2006

(54) TECHNIQUES FOR COOLING A CIRCUIT BOARD COMPONENT WITHIN AN ENVIRONMENT WITH LITTLE OR NO FORCED CONVECTION AIRFLOW

(75) Inventors: Hong Huynh, Fremont, CA (US); Susheela Narasimhan, Milpitas, CA (US); Michael Koken, Sunnyvale, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 10/988,713

(22) Filed: Nov. 15, 2004

(65) Prior Publication Data

US 2006/0103013 A1    May 18, 2006

(51) Int. Cl.
*H05K 7/20* (2006.01)
(52) U.S. Cl. .................. 361/704; 257/712; 257/713; 257/706; 257/E23.8; 257/E23.087; 257/E23.101; 361/679; 361/688
(58) Field of Classification Search .................. None
See application file for complete search history.

(56) References Cited

U.S. PATENT DOCUMENTS 5,440,169 A * 8/1995 Tomita et al. .............. 257/667
5,814,536 A * 9/1998 Rostoker et al. ............ 438/122
2003/0068920 A1 * 4/2003 Li et al. ..................... 439/502
2003/0200548 A1 * 10/2003 Baran et al. ................. 725/90

* cited by examiner

Primary Examiner—Minhloan Tran
Assistant Examiner—Leslie Pilar Cruz
(74) Attorney, Agent, or Firm—BainwoodHuang

(57) ABSTRACT

A dimpled heat spreader includes a central portion configured to couple to the circuit board component, an outer portion coupled to the central portion, and dimpled portions disposed within the outer portion. The outer portion is configured to extend from the central portion and support the dimpled portions beyond a footprint of the circuit board component when the central portion couples to the circuit board component. The dimpled portions of such a heat spreader provides more exposed surface area (e.g., per square inch) than conventional heat spreaders with flat end portions for improved and enhanced heat dissipation via natural convection into the ambient air. Moreover, a heat spreader with such dimpled portions is relatively easy and cost effective to make vis-à-vis more complex structures such as fins or posts thus enabling a manufacturer to produce dimpled heat spreaders using a high volume, low cost assembly process.

19 Claims, 5 Drawing Sheets

TECHNIQUES FOR COOLING A CIRCUIT BOARD COMPONENT WITHIN AN ENVIRONMENT WITH LITTLE OR NO FORCED CONVECTION AIRFLOW

BACKGROUND

In general, a heatsink is a large, metallic device having (i) a base which is configured to mount on top of an integrated circuit (IC) package and (ii) fins or posts coupled to the base which extend away from the IC package and into an airstream generated by a fan assembly, i.e., forced convection airflow. Unfortunately, heatsinks are inappropriate in certain environments such as tight or narrow confined spaces in which there is only natural convection available (e.g., a substantially enclosed space with no forced convection airflow) or where forced convection airflow is minimal (e.g., constricted spaces between daughter cards which connect to a motherboard).

One conventional cooling approach for cooling an IC package within a tight space is to use a conventional heat spreader, i.e., a flat metallic device which attaches to the top of an IC package and which dissipates heat into the ambient air with minimal or no access to forced convection airflow. One conventional heat spreader model has two flat end portions and a flat middle portion all of which are substantially 0.013 inches thick. The flat middle portion has substantially the same width and length as the IC package. Each flat end portion has pre-scored bend lines (or folding scores). To install the heat spreader, a technician peals off a protecting seal of adhesive material which is stuck to the flat middle portion. The technician then presses the flat middle portion of the heat spreader onto the IC package so that the flat middle portion adheres to the top of the IC package. If the IC package sits in a restricted space between adjacent circuit board structures (e.g., other neighboring IC packages) the technician can bend each flat end portion along a pre-scored bend line so that the flat end portions do not interfere with the adjacent circuit board structures.

Another conventional heat spreader model includes a monolithic structure which is substantially 0.060 inches thick and has substantially the same width and length as the IC package. This heat spreader does not have any portions that extend beyond the footprint of the IC package. That is, this heat spreader substantially matches the footprint of the IC package along all four sides and simply adheres to the top of the IC package using adhesive in a manner similar to that for the above-described heat spreader with the flat end portions.

SUMMARY

In contrast to the above-described conventional cooling approaches, there is an improved dimpled heat spreader which is capable of providing robust cooling to a circuit board component within a natural convection environment. Dimpled portions of the heat spreader increase the total surface area of the heat spreader to advantageously augment heat dissipation beyond that provided by conventional heat spreaders with only flat end portions. For example, a dimpled heat spreader is capable of providing substantially enhanced cooling to an IC device by reducing the operating temperature of the IC device by a significant amount (e.g., by 9%), thus moving the operating temperature of the IC device from a critical temperature (e.g., 109 degrees Celsius in 45 degree ambient air) to a temperature or temperature range in which it is safe and reliable to operate (e.g., 100 degrees Celsius).

In one arrangement, the dimpled heat spreader includes a central portion configured to couple to the circuit board component, an outer portion coupled to the central portion, and dimpled portions disposed within the outer portion. The outer portion is configured to extend from the central portion and support the dimpled portions beyond a footprint of the circuit board component when the central portion couples to the circuit board component. The dimpled portions of such a heat spreader provides more exposed surface area (e.g., per square inch) than conventional heat spreaders with flat end portions for improved and enhanced heat dissipation via natural convection into the ambient air. Moreover, a heat spreader with such dimpled portions is relatively easy and cost effective to make vis-à-vis more complex structures such as fins or posts thus enabling a manufacturer to produce dimpled heat spreaders using a high volume, low cost assembly process.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

An improved dimpled heat spreader is capable of providing robust cooling to a circuit board component within a natural convection environment. Dimpled portions of the heat spreader increase the total surface area of the heat spreader to advantageously augment heat dissipation beyond that provided by conventional heat spreaders with only flat end portions. For example, a dimpled heat spreader is capable of providing substantially enhanced cooling to an IC device by reducing the operating temperature of the IC device by a significant amount (e.g., by 9%), thus moving the operating temperature of the IC device from a critical temperature (e.g., 109 degrees Celsius in 45 degree ambient air) to a temperature or temperature range in which it is safe and reliable to operate (e.g., 100 degrees Celsius).

Figure 1:
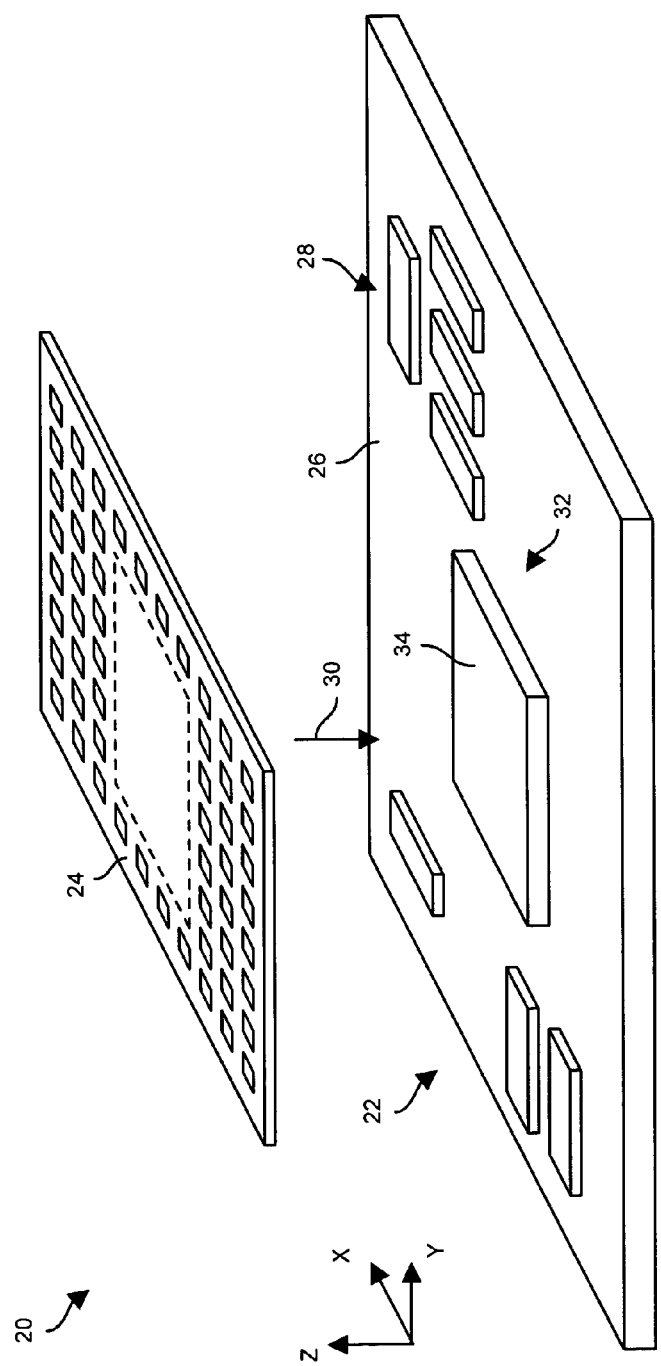
FIG. 1 shows a perspective view of a heat spreader and a circuit board module.

FIG. 1 shows a perspective view of an electronic device 20 having a circuit board module 22 and a dimpled heat spreader 24. The circuit board module 22 includes a circuit board 26 (i.e., a PCB) and a set of circuit board components 28 mounted to the circuit board 26. The dimpled heat spreader 24 is configured to attach to the circuit board module 22 (see the arrow 30) and then cool a circuit board component 28 while the electronic device 20 is in operation.

By way of example, the circuit board component 28 cooled by the dimpled heat spreader 24 is an integrated circuit (IC) device having a rectangular footprint 32, and a relatively flat top surface 34. There are a variety of IC devices which are suitable as the component 28 such as ceramic or metallic packaged processors, Application Specific Integrated Circuits (ASICs), Field Programmable Gate Arrays (FPGAs), and the like. Furthermore, such devices are capable of mounting to the circuit board 26 in a variety of ways such as using Ball Grid Arrays (BGAs), Ceramic Column Grid Arrays (CCGAs), pins/posts (e.g., solder mount, compression fit, etc.), gull-wing leads, and the like.

The dimpled heat spreader 24 is capable of attaching to the circuit board module 22 in a variety of ways. One way involves simply fastening the dimpled heat spreader 24 directly to the top of the circuit board component 28 using thermal adhesive, e.g., a pressure sensitive adhesive (PSA) having a high thermal transfer coefficient. Another way involves mounting the dimpled heat spreader 24 to the circuit board 26 (e.g., using hardware, clips, fasteners, etc.) and inserting thermal transfer material (e.g., thermal phase change material) between the top of the component 28 and the heat spreader 24. Other ways are suitable as well. Further details of the dimpled heat spreader 24 will now be provided with reference to FIGS. 2 and 3.

Figure 2:
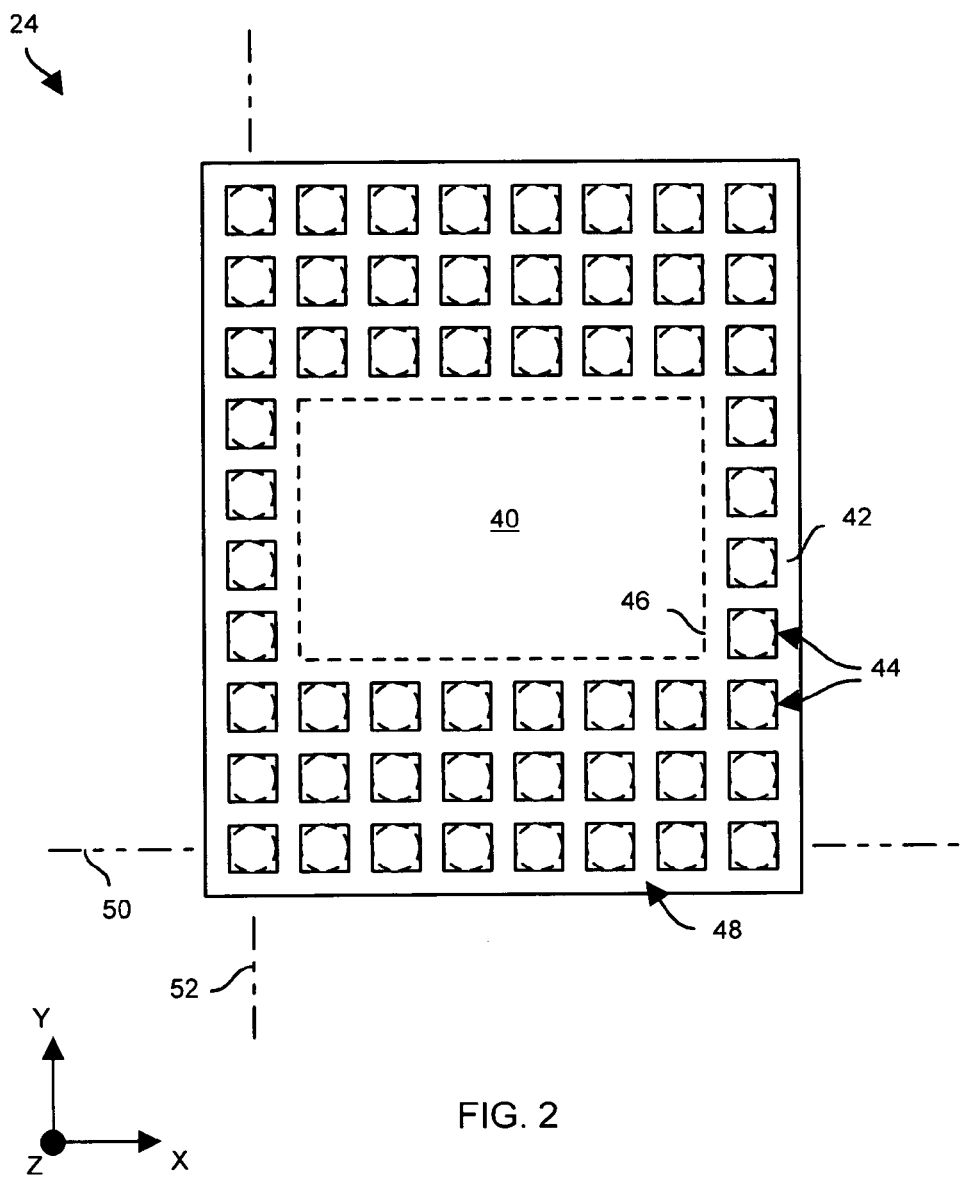
FIG. 2 is a top view of the heat spreader of FIG. 1.
Figure 3:
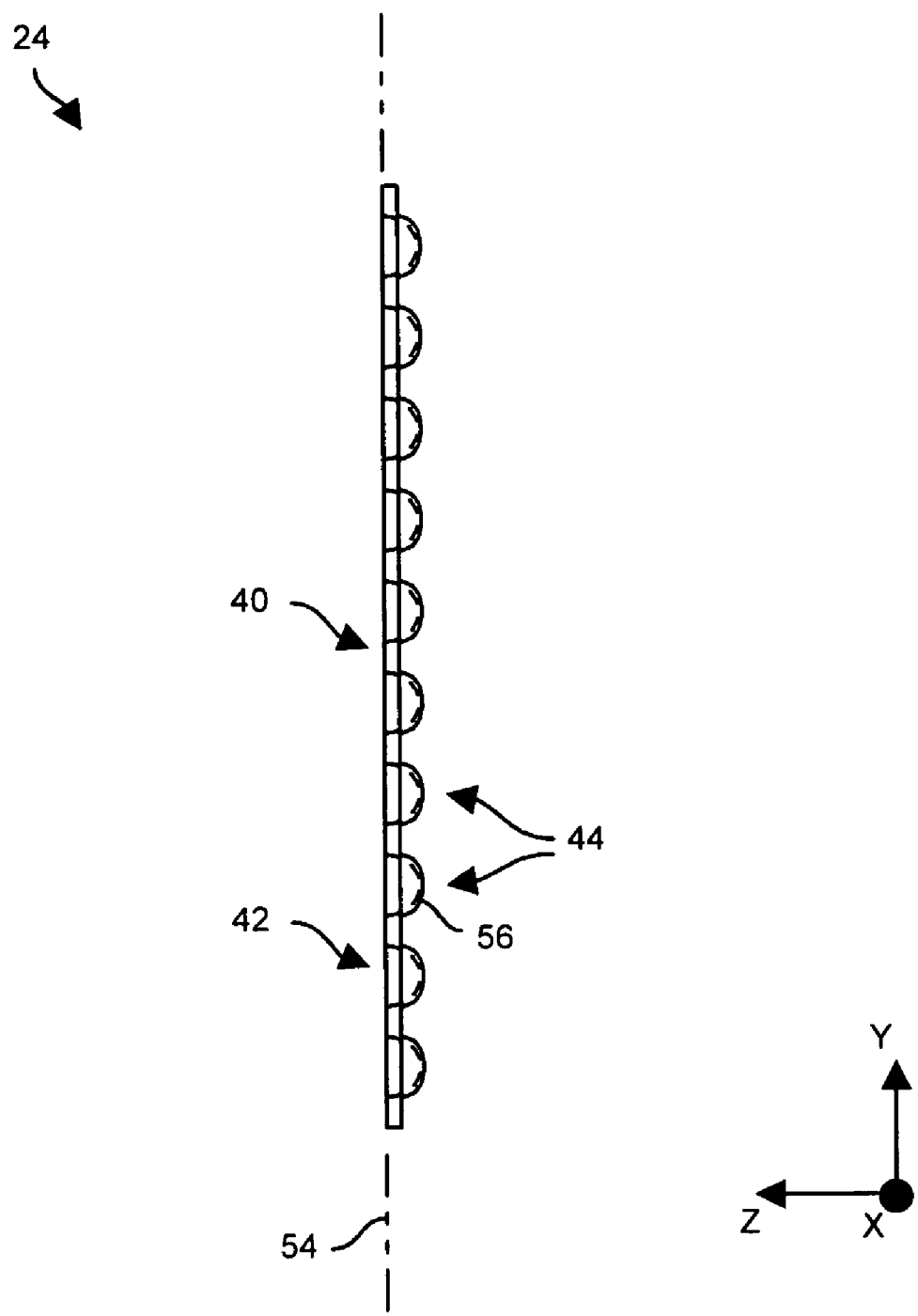
FIG. 3 is a side view of the heat spreader of FIGS. 1 and 2.

FIG. 2 is a top view of the dimpled heat spreader 24, and FIG. 3 is a side view of the dimpled heat spreader 24. As shown, the heat spreader 24 includes a central portion 40, an outer portion 42 and dimpled portions 44. The central portion 40 is substantially planar in shape (i.e., in the X-Y plane of FIG. 2) and is configured to couple to the circuit board component 28 (e.g., through direct contact, via thermal grease, via thermal adhesive, etc.). The output portion 42 extends from the central portion 40, and supports the dimpled portions 44.

As shown in FIG. 2, the central portion 40 of the heat spreader 24 defines a rectangle 46 in order to mirror the footprint of the circuit board component 28 (also see FIG. 1). The dimpled portions 44 are disposed adjacent all of four sides of the rectangle 46 and thus surrounds the central portion 40 to provide enhanced heat dissipation in all directions, i.e., 360 degrees. By way of example, the dimpled portions 44 are arranged as a two-dimensional array 48 by residing in substantially straight rows 50 along the X-axis, and in substantially straight columns 52 along the Y-axis. Accordingly, the dimpled portions 44 are uniformly and robustly distributed within the output portion 42 to improve the amount of exposed surface area.

As shown in FIG. 3, the central portion 40 and the output portion 42 define a plane 54, i.e., the portions 40, 42 are substantially coplanar with each other in an X-Y plane. The dimpled portions 44 protrude from the plane 54 along the Z-axis. Preferably, the dimpled portions 44 define bosses 56 which extend in a common direction, i.e., the negative Z-direction in FIG. 3. By way of example, the bosses 56 are circular in shape and are formed by pressing parts of initially flat metal stock (e.g., beryllium copper, aluminum, steel, combinations thereof, similar alloys, etc.) as part of a high volume, low cost stamping and pressing process on the initially flat metal stock.

It should be understood that experimental results have shown that the dimpled heat spreader 24 provides improved heat dissipation over conventional flat plate-type heat spreaders. For example, in an experiment comparing the dimpled heat spreader 24 to a conventional flat plate heat spreader in horizontal mounting scenarios, the results showed that the dimpled heat spreader 24 provided 4.8% better performance than the conventional flat plate heat spreader. Similarly, in an experiment comparing the dimpled heat spreader 24 to a conventional flat plate heat spreader in vertical mounting scenarios, the results showed that the dimpled heat spreader 24 provided 6.5% better performance than the conventional flat plate heat spreader. Further details will now be provided with reference to FIG. 4.

Figure 4:
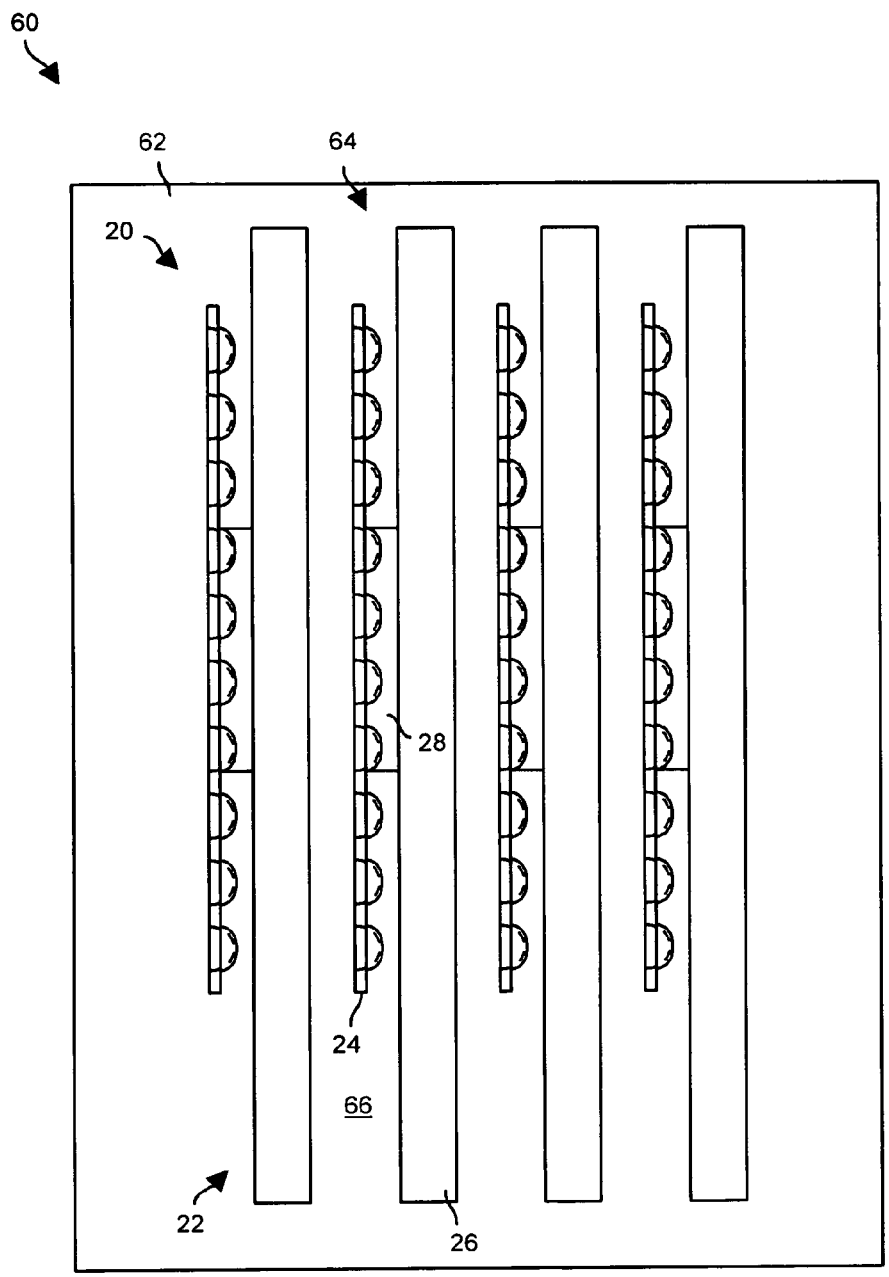
FIG. 4 is a side view of an electronic device which utilizes the heat spreader and circuit board module of FIG. 1.

FIG. 4 is a side view of a data communications system 60 having a 10 Gigabit Ethernet motherboard 62 and multiple daughter cards 64. Each daughter card 64 has the configuration of the electronic device 20 of FIG. 1. That is, each daughter card 64 includes a circuit board module 22 and a heat spreader 24, the circuit board module 22 having a circuit board 26 and circuit board components 28. In the context of the data communications system 60, the circuit board modules 22 are configured to perform 10 Gigabit Ethernet operations. The motherboard 62 provides power to the daughter cards 64, and enables the daughter cards 64 to communicate with each other.

As shown in FIG. 4, the 10 Gigabit Ethernet motherboard 62 extends in the Y-Z plane, and the daughter cards 64 extend in the X-Y plane and are disposed substantially parallel to each other. By way of example, the data communications system 60 is characterized as a high-end, high density electronic system which consumes high power in order to perform high speed data communications operations. As such, the amount of space 66 between neighboring daughter cards 64 is limited (e.g., less than or equal to 1.5 inches). Accordingly, these spaces 66 are somewhat confined and there is little or no opportunity to provide forced convection airflow through the system 60.

Nevertheless, as shown in FIG. 4, each daughter card 64 utilizes a heat spreader 24 to augment heat dissipation from that daughter card 64. In particular, the heat spreader 24 of each daughter card 64 reduces the operating temperature of an important component 28 (with a moderate power dissipation of approximately 5–10 Watts) by a significant amount (e.g., 9%). Accordingly, if the component 28 would otherwise operate in a critical temperature range (e.g., 109 degrees Celsius in ambient air), the heat spreader 24 is capable of lowering the operating temperature into a safer and more reliable temperature range (e.g., 100 degrees Celsius). Further details will now be provided with reference to FIG. 5.

Figure 5:
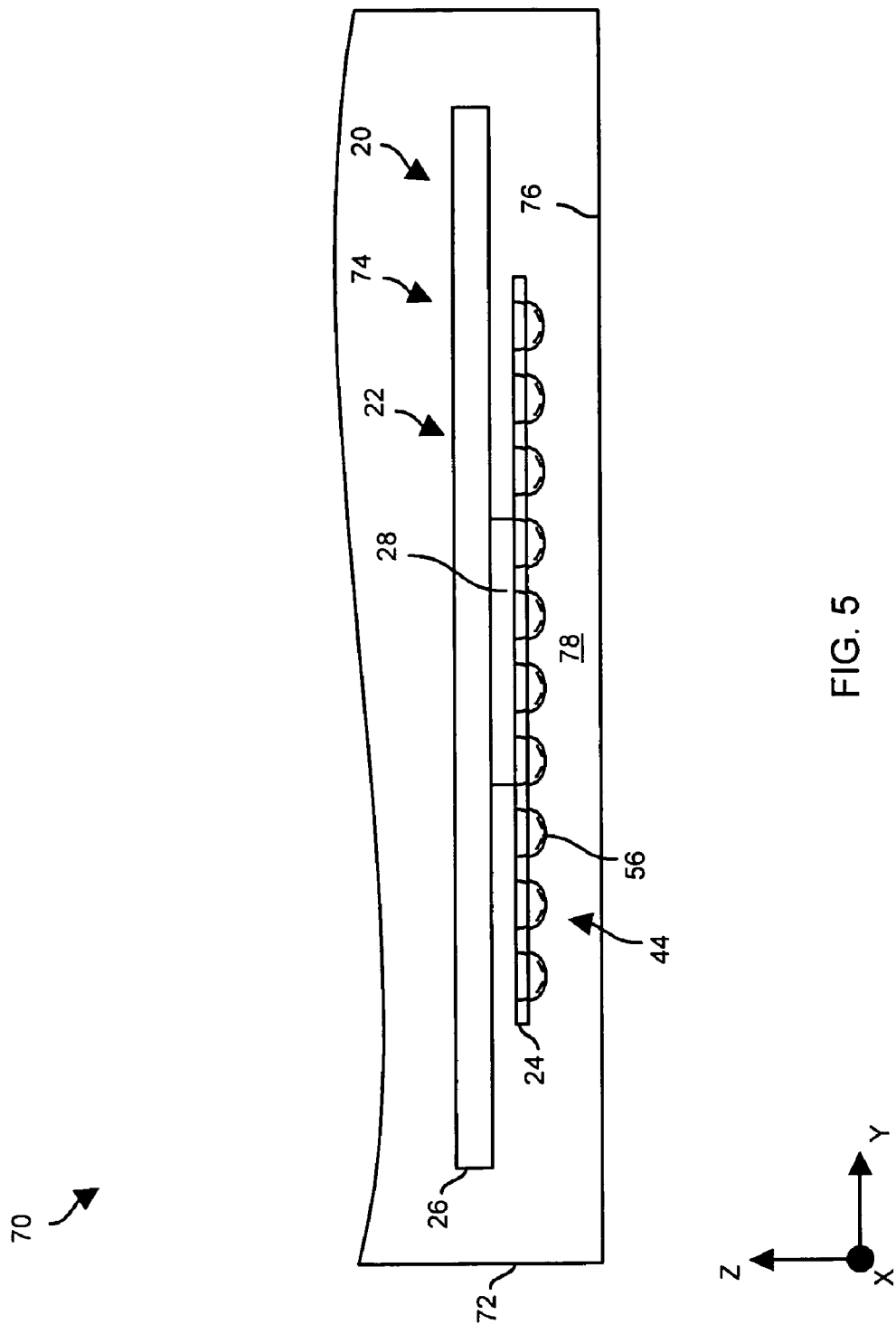
FIG. 5 is a side view of an alternate electronic device which utilizes the heat spreader and circuit board module of FIG. 1.

FIG. 5 is a side view of a Voice over IP (VOIP) telephone 70 having an enclosure 72 and a phone card 74. The phone card 74 has the configuration of the electronic device 20 of FIG. 1. That is, the phone card 74 includes a circuit board module 22 and a heat spreader 24, with the circuit board module 22 including a circuit board 26 and circuit board components 28. In the context of the VOIP telephone 70, the circuit board module 22 is configured to perform VOIP telephone operations.

As shown in FIG. 5, both the circuit board module 22 and the heat spreader 24 extend horizontally in the X-Y plane. The heat spreader 24 is beneath the circuit board module 22 and is in robust thermal communication with a component 28 mounted to the circuit board 26. By way of example, the space 78 between heat spreader 24 and the bottom wall 76 of the enclosure 72 (e.g., an injection molded plastic housing) is limited (e.g., 0.3 inches between the top of the component 28 and the bottom wall 76). Accordingly, the space 78 between the heat spreader 24 and the enclosure 72 is substantially confined and there is little ability if any to provide force convection airflow through the system 70.

That is, there is no forced convention airflow available and the phone card 74 resides within a natural convection environment.

Nevertheless, as shown in FIG. 5, the heat spreader 24 augments heat dissipation from phone card 74. In particular, heat is capable of radiating from the heat spreader 24 in all directions. The bosses 56 of the dimpled portions 44 point in the downward direction (i.e., the negative Z-direction in FIG. 5) thus facilitating natural convection airflow and preventing hot air from becoming trapped within the bosses 56. As a result, the heat spreader 24 decreases the operating temperature of the component 28 by a significant amount (e.g., 9%). Thus, if the component 28 (with a moderate power dissipation of approximately 5–10 Watts) were to otherwise operate in a critical temperature range (e.g., 109 degrees Celsius in ambient air), the heat spreader 24 is capable of reducing the operating temperature into a safer and more reliable range (e.g., 100 degrees Celsius).

As described above, an improved dimpled heat spreader 24 is capable of providing robust cooling to a circuit board component 28 within a natural convection environment. Dimpled portions 44 of the heat spreader 24 increase the total surface area of the heat spreader 24 to advantageously augment heat dissipation beyond that provided by conventional heat spreaders with only flat end portions. In some situations, a temperature reduction of roughly 8%–10% (e.g., 9 degrees Celsius) provided by the heat spreader 24 may be crucial to placing a circuit board component 28 within a reliable operating temperature range. Moreover, such a heat spreader 24 is relatively easy and cost effective to make vis-à-vis more complex structures such as heatsinks having fins or posts thus enabling a manufacturer to produce the dimpled heat spreaders 24 using a high volume, low cost assembly process (e.g., a pressing and stamping process).

While this invention has been particularly shown and described with references to preferred embodiments thereof, it will be understood by those skilled in the art that various changes in form and details may be made therein without departing from the spirit and scope of the invention as defined by the appended claims.

For example, the dimpled heat spreader 24 was described above as being well-suited for environments which are inappropriate or impractical for conventional heat spreaders such as narrow or restricted spaces with limited or no access to forced convection airflow. It should be understood that nothing precludes the dimpled heat spreaders 24 from being used in other environments as well such as those non-confined spaces with access to forced convection airflows in which larger, more complex heat spreaders are used. The dimpled heat spreaders 24 provide a low cost, simple alternative to conventional heat spreaders.

What is claimed is:

1. An electronic device, comprising:
   a circuit board;
   a circuit board component mounted to the circuit board;
   a heat spreader configured to cool the circuit board component, the heat spreader including:
      a central portion coupled to the circuit board component,
      an outer portion coupled to the central portion, and
      dimpled portions disposed within the outer portion, the outer portion extending from the central portion and supporting the dimpled portions beyond a footprint of the circuit board component; and
   a Voice Over IP telephone chassis which provides a natural convection environment and supports the circuit board in a substantially horizontal orientation; wherein the heat spreader is disposed between the circuit board and a bottom of the Voice Over IP telephone chassis; and wherein the heat spreader defines a horizontal plane within the natural convection environment; and wherein the dimpled portions of the heat spreader define bosses which protrude from the horizontal plane in a downward direction.

2. The electronic device of claim 1 wherein the heat spreader resides within a narrow air space having a width confined by walls, the walls confining the width to fall within a range of 1.5 inches to 0.3 inches.

3. The electronic device of claim 1, further comprising:
   a 10 Gigabit Ethernet motherboard, and wherein the circuit board is a daughter card disposed between other neighboring daughter cards, all of the daughter cards connecting to the 10 Gigabit Ethernet motherboard and being disposed substantially parallel to each other, the heat spreader being disposed between a narrow limited-airflow space between a pair of daughter cards.

4. The electronic device of claim 1 wherein the footprint of the circuit board component defines a rectangle; and wherein the dimpled portions of the heat spreader are disposed adjacent to multiple sides of the rectangle.

5. The electronic device of claim 4 wherein the dimpled portions of the heat spreader are disposed adjacent to all four sides of the rectangle to surround the footprint of the circuit board component.

6. The electronic device of claim 1 wherein the outer portion of the heat spreader encircles the central portion of the heat spreader and defines a plane; and wherein the dimpled portions of the heat spreader define bosses which protrude from the plane in a common direction.

7. The electronic device of claim 6 wherein the bosses are distributed into rows and columns within the plane.

8. The electronic device of claim 6 wherein the central portion and the outer portion of the heat spreader are substantially coplanar with each other.

9. The electronic device of claim 1 wherein the dimpled portions of the heat spreader are formed from a process where a substantially flat sheet of metal stock is stamped and pressed.

10. An electronic device, comprising:
    a circuit board;
    a circuit board component mounted to the circuit board;
    a heat spreader configured to cool the circuit board component, the heat spreader including:
       a central portion coupled to the circuit board component,
       dimpled portions disposed within the outer portion, and
       means, coupled to the central portion, for supporting the dimpled portions beyond a footprint of the circuit board component; and
    a Voice Over IP telephone chassis which provides a natural convection environment and supports the circuit board in a substantially horizontal orientation; wherein the heat spreader is disposed between the circuit board and a bottom of the Voice Over IP telephone chassis; and wherein the heat spreader defines a horizontal plane within the natural convection environment; and wherein the dimpled portions of the heat spreader define bosses which protrude from the horizontal plane in a downward direction.

11. The electronic device of claim 10 wherein the footprint of the circuit board component defines a rectangle; and wherein the dimpled portions of the heat spreader are disposed adjacent to all four sides of the rectangle to surround the footprint of the circuit board component in a row and column arrangement.

12. The electronic device of claim 10 wherein the dimpled portions of the heat spreader are formed from a process where a substantially flat sheet of metal stock is stamped and pressed.

13. A heat spreader to cool a circuit board component within a natural convection environment, the heat spreader comprising:
a central portion configured to couple to the circuit board component;
an outer portion coupled to the central portion; and
dimpled portions disposed within the outer portion, the outer portion being configured to extend from the central portion and support the dimpled portions beyond a footprint of the circuit board component when the central portion couples to the circuit board component;
wherein the heat spreader is configured to dissipate heat within a Voice Over IP telephone chassis which provides a natural convection environment and supports a circuit board in a substantially horizontal orientation, the circuit board being coupled to the circuit board component; wherein the heat spreader is disposed between the circuit board and a bottom of the Voice Over IP telephone chassis; wherein the heat spreader defines a horizontal plane within the natural convection environment; and wherein the dimpled portions of the heat spreader define bosses which protrude from the horizontal plane in a downward direction.

14. The heat spreader of claim 13 wherein the footprint of the circuit board component defines a rectangle; and wherein the dimpled portions are disposed adjacent to multiple sides of the rectangle.

15. The heat spreader of claim 14 wherein the dimpled portions are disposed adjacent to all four sides of the rectangle to surround the footprint of the circuit board component when the central portion couples to the circuit board component.

16. The heat spreader of claim 13 wherein the outer portion encircles the central portion and defines a plane; and wherein the dimpled portions define bosses which protrude from the plane in a common direction.

17. The heat spreader of claim 16 wherein the bosses are distributed into rows and columns within the plane.

18. The heat spreader of claim 16 wherein the central portion and the outer portion are substantially coplanar with each other.

19. The heat spreader of claim 13 wherein the dimpled portions of the heat spreader are formed from a process where a substantially flat sheet of metal stock is stamped and pressed.

* * * * *